(12) United States Patent
Tu et al.

(10) Patent No.: US 10,186,538 B2
(45) Date of Patent: Jan. 22, 2019

(54) SENSOR PACKAGE STRUCTURE

(71) Applicant: KINGPAK TECHNOLOGY INC., Hsin-Chu County (TW)

(72) Inventors: Hsiu-Wen Tu, Hsin-Chu County (TW); Chung-Hsien Hsin, Hsin-Chu County (TW); Jian-Ru Chen, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 15/641,378

(22) Filed: Jul. 5, 2017

(65) Prior Publication Data

US 2018/0012919 A1 Jan. 11, 2018

Related U.S. Application Data

(60) Provisional application No. 62/358,643, filed on Jul. 6, 2016.

(30) Foreign Application Priority Data

Sep. 30, 2016 (CN) .......................... 2016 1 0868073

(51) Int. Cl.
*H01L 27/146* (2006.01)

(52) U.S. Cl.
CPC .... *H01L 27/14618* (2013.01); *H01L 27/1469* (2013.01); *H01L 27/14634* (2013.01);
(Continued)

(58) Field of Classification Search
CPC .......... H01L 27/14618; H01L 27/1469; H01L 27/14636; H01L 27/14634
(Continued)

(56) References Cited

U.S. PATENT DOCUMENTS 5,468,999 A 11/1995 Lin et al.
7,939,361 B2 * 5/2011 Honda .............. H01L 27/14618
257/432

(Continued)

FOREIGN PATENT DOCUMENTS

JP 2002-076154 A 3/2002
JP 2015-19031 A 1/2015
WO WO 2008/032404 A1 3/2008

*Primary Examiner* — Marc Armand
*Assistant Examiner* — Sue Tang
(74) *Attorney, Agent, or Firm* — Li & Cai Intellectual Property (USA) Office

(57) ABSTRACT

A sensor package structure includes a substrate, a sensor chip disposed on the substrate, several metal wires electrically connected to the substrate and the sensor chip, a translucent layer corresponding in position to the sensor chip, and an adhesive. A top surface of the sensor chip has a sensing region and a spacing region around the sensing region. The sensor chip includes several connecting pads arranged on a first portion of the top surface between the first edge and the spacing region, and a second portion of the top surface between the second edge and the spacing region is provided without any connecting pad. The width of the first portion is greater than that of the second portion. The adhesive covers the surrounding side of the sensor chip, the first portion, and the surrounding side of the translucent layer. Part of each metal wire is embedded in the adhesive.

14 Claims, 13 Drawing Sheets

(52) U.S. Cl.
CPC ............... *H01L 27/14636* (2013.01); *H01L 2224/48091* (2013.01); *H01L 2924/15311* (2013.01); *H01L 2924/16235* (2013.01)

(58) Field of Classification Search
USPC ........................................... 257/434
See application file for complete search history.

(56) References Cited

U.S. PATENT DOCUMENTS

| | | |
|---|---|---|
| 8,969,120 B2 | 3/2015 | Huang et al. |
| 2007/0272846 A1* | 11/2007 | Wu .................. H01L 27/14618 250/239 |
| 2008/0079105 A1* | 4/2008 | Chang .................. H01L 24/97 257/434 |
| 2009/0166784 A1 | 7/2009 | Honda |

* cited by examiner

SENSOR PACKAGE STRUCTURE

BACKGROUND OF THE INVENTION

1. Field of the Invention

The present invention relates to a package structure; in particular, to a sensor package structure.

2. Description of Related Art

Electronic components within a conventional electronic device need to be developed toward being smaller in size, such that more electronic components can be disposed within the conventional electronic device. However, the conventional sensor package structure (e.g., an image sensor package structure) is not suitable for packaging a sensor chip of smaller size, rendering the task of miniaturization a difficult one.

SUMMARY OF THE INVENTION

The present disclosure provides a sensor package structure for effectively improving the drawbacks associated with conventional sensor package structures.

The present disclosure provides a sensor package structure. The sensor package structure includes a substrate, a sensor chip, a plurality of metal wires, a first combining layer, a second combining layer, a translucent layer, and a packaging compound. The substrate has an upper surface and a lower surface opposite to the upper surface. The substrate includes a plurality of welding pads formed on the upper surface. The sensor chip has a top surface and a bottom surface opposite to the top surface, and the bottom surface of the sensor chip is disposed on the upper surface of the substrate. The top surface has a sensing region and a spacing region arranged around the sensing region. The top surface has at least one first edge and at least one second edge, the sensor chip includes a plurality of connecting pads formed on a first portion of the top surface between the at least one first edge and the spacing region; and a second portion of the top surface between the at least one second edge and the spacing region is provided without any connecting pad. One ends of the metal wires are respectively connected to the welding pads, and the other ends of the metal wires are respectively connected to the connecting pads. The first combining layer is disposed on the first portion of the top surface between the at least one first edge and the spacing region. The second combining layer is disposed on the second portion of the top surface and arranged adjacent to the at least one second edge. A height of the second combining layer with respect to the upper surface is substantially equal to that of the first combining layer with respect to the upper surface. The translucent layer has a first surface and a second surface opposite to the first surface, and a portion of the second surface of the translucent layer is adhered to the first combining layer and the second combining layer. The packaging compound is disposed on the upper surface of the substrate and covers a surrounding side of the sensor chip, an outer side of the first combining layer, an outer side of the second combining layer, and a surrounding side of the translucent layer. At least part of each of the metal wires and each of the welding pads are embedded in the packaging compound.

Exemplarily, the outer side of the first combining layer arranged distant from the sensing region includes an arc surface having a center of circle located in the packaging compound.

Exemplarily, in a cross-section of the sensor package structure perpendicular to the upper surface, the outer side of the second combining layer arranged distant from the sensor chip is in an S-shape.

Exemplarily, a distance between the outer side of the second combining layer and the sensing region is substantially equal to a distance between the at least one first edge and the sensing region.

Exemplarily, the second combining layer is further disposed on the second portion of the top surface between the at least one second edge and the spacing region.

Exemplarily, an area of the second portion of the top surface is smaller than that of a portion of the spacing region connected to the second portion of the top surface.

Exemplarily, a distance between the at least one first edge and the spacing region is greater than a distance between the at least one second edge and the spacing region.

Exemplarily, a projecting area defined by orthogonally projecting the sensor chip onto the second surface is entirely located in the second surface. The second surface has a fixing region arranged outside the portion of the second surface adhered to the first combining layer and the second combining layer, and the packaging compound covers the fixing region.

Exemplarily, the packaging compound is a liquid compound, and the first surface of the translucent layer and an adjacent surface of the packaging compound have an angle within a range of 90~180 degrees.

Exemplarily, the sensor package structure further includes a molding compound disposed on a top surface of the packaging compound A top surface of the molding compound is substantially parallel to the first surface, and a surrounding side surface of the molding compound is coplanar with a surrounding side surface of the packaging compound.

Exemplarily, the packaging compound is a molding compound, and the first surface of the translucent layer and an adjacent surface of the packaging compound have an angle of 180 degrees.

The present disclosure also provides a sensor package structure. The sensor package structure includes a substrate, a sensor chip, a plurality of metal wires, a translucent layer, and an adhesive. The substrate has an upper surface and a lower surface opposite to the upper surface. The substrate includes a plurality of welding pads formed on the upper surface. The sensor chip has a top surface and a bottom surface opposite to the top surface, and the bottom surface of the sensor chip is disposed on the upper surface of the substrate. The top surface has a sensing region and a spacing region arranged around the sensing region. The top surface has at least one first edge and at least one second edge, and a distance between the at least one first edge and the spacing region is greater than a distance between the at least one second edge and the spacing region. The sensor chip includes a plurality of connecting pads formed on a first portion of the top surface between the at least one first edge and the spacing region; and a second portion of the top surface between the at least one second edge and the spacing region is provided without any connecting pad. One ends of the metal wires are respectively connected to the welding pads, and the other ends of the metal wires are respectively connected to the connecting pads. The translucent layer has a first surface and a second surface opposite to the first surface, and the second surface of the translucent layer faces toward the top surface of the sensor chip. The adhesive is disposed on the upper surface of the substrate and covers a surrounding side of the sensor chip, the first portion of the top surface, and a surrounding side and a portion of the second surface of the translucent layer. At least part of each of the metal wires and each of the welding pads are embedded in the adhesive.

Exemplarily, the adhesive includes a supporting layer, a combining layer, and a packaging compound. The supporting layer is arranged adjacent to the at least one second edge. An edge of the supporting layer arranged distant from the substrate has a height substantially equal to a height of the upper surface of the sensor chip. The combining layer is disposed on the supporting layer and the first portion of the top surface of the sensor chip. The portion of the second surface of the translucent layer is adhered to the combining layer. The packaging compound is disposed on the upper surface of the substrate, and covers the surrounding side of the sensor chip, an outer side of the supporting layer arranged distant from the sensor chip, a surrounding side of the combining layer arranged distant from the sensing region, and the surrounding side of the translucent layer. At least part of each of the metal wires and each of the welding pads are embedded in the packaging compound.

Exemplarily, the outer side of the supporting layer includes an arc surface having a center of circle located at an interior side of the packaging compound.

Exemplarily, the surrounding side of the combining layer includes an arc surface having a center of circle located in the packaging compound.

Exemplarily, a distance between the surrounding side of the combining layer and the sensing region is substantially equal to a distance between the at least one first edge and the sensing region.

Exemplarily, the combining layer is further disposed on the second portion of the top surface between the at least one second edge and the spacing region.

Exemplarily, an area of the second portion of the top surface is smaller than that of a portion of the spacing region connected to the second portion of the top surface.

Exemplarily, a projecting area defined by orthogonally projecting the sensor chip onto the second surface is entirely located in the second surface, the second surface has a fixing region arranged outside the portion of the second surface adhered to the combining layer, and the packaging compound covers the fixing region.

In summary, the sensor chip in the present disclosure, which has the second portion provided without any connecting pad, can be adapted in the sensor package structure. That is to say, the sensor package structure of the present disclosure is suitable to package the sensor chip which has a smaller size.

In order to further appreciate the characteristics and technical contents of the present invention, references are hereunder made to the detailed descriptions and appended drawings in connection with the present invention. However, the appended drawings are merely shown for exemplary purposes, and should not be construed as restricting the scope of the present invention.

DETAILED DESCRIPTION OF THE PREFERRED EMBODIMENTS

References are hereunder made to the detailed descriptions and appended drawings in connection with the present invention. However, the appended drawings are merely provided for exemplary purposes, and should not be construed as restricting the scope of the present invention.

First Embodiment

Figure 1:
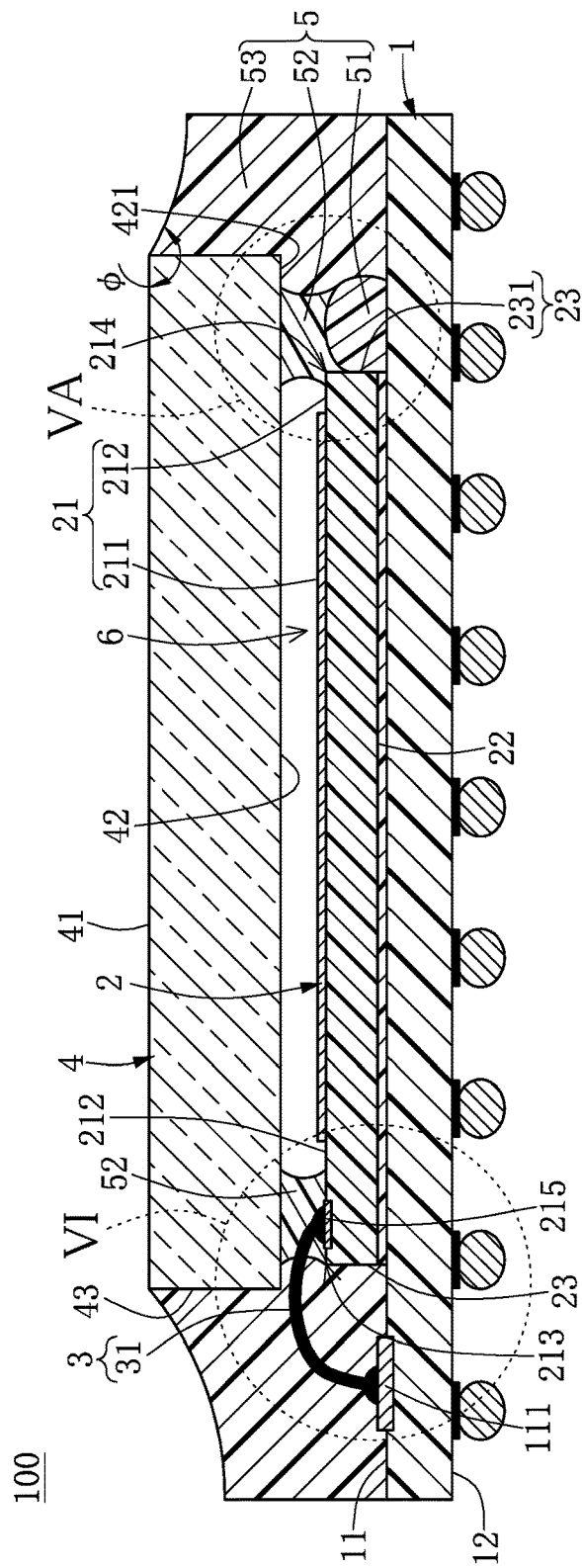
FIG. 1 is a cross-sectional view showing a sensor package structure according to a first embodiment of the present disclosure.
Figure 2:
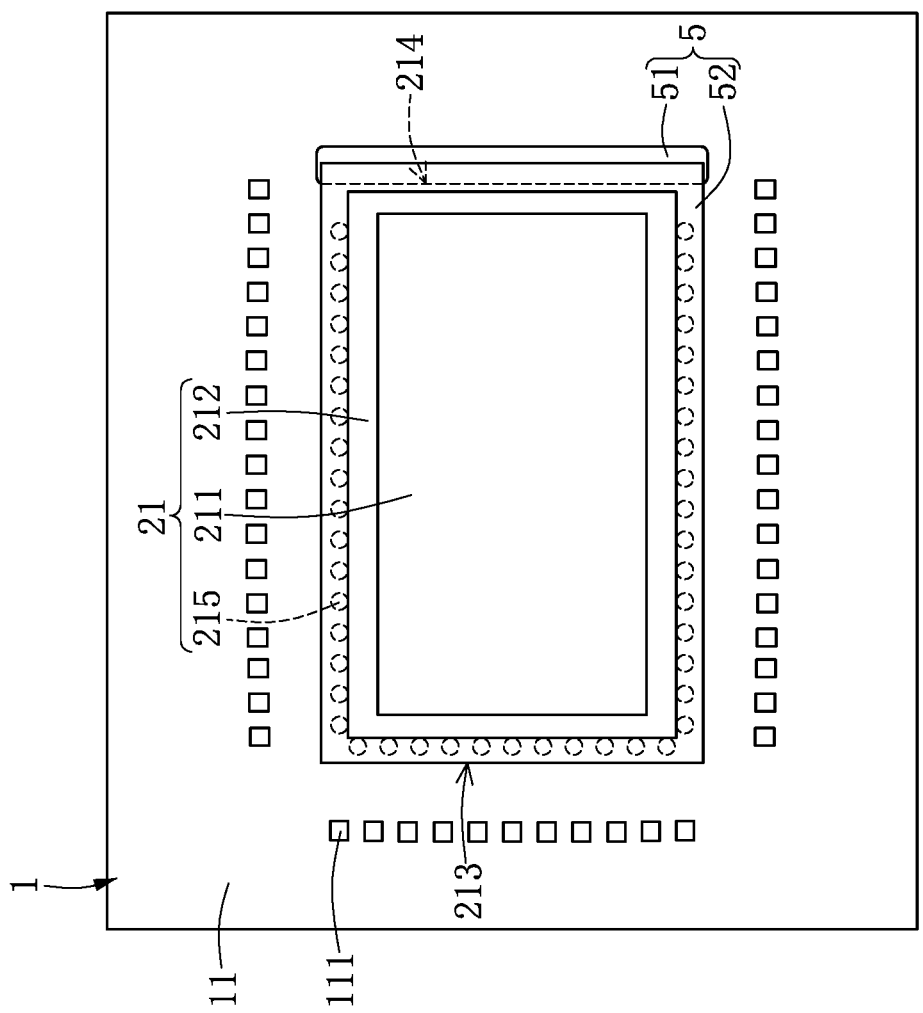
FIG. 2 is a top view of FIG. 1 with the packaging compound, the translucent layer, and the metal wires omitted.
Figure 3:
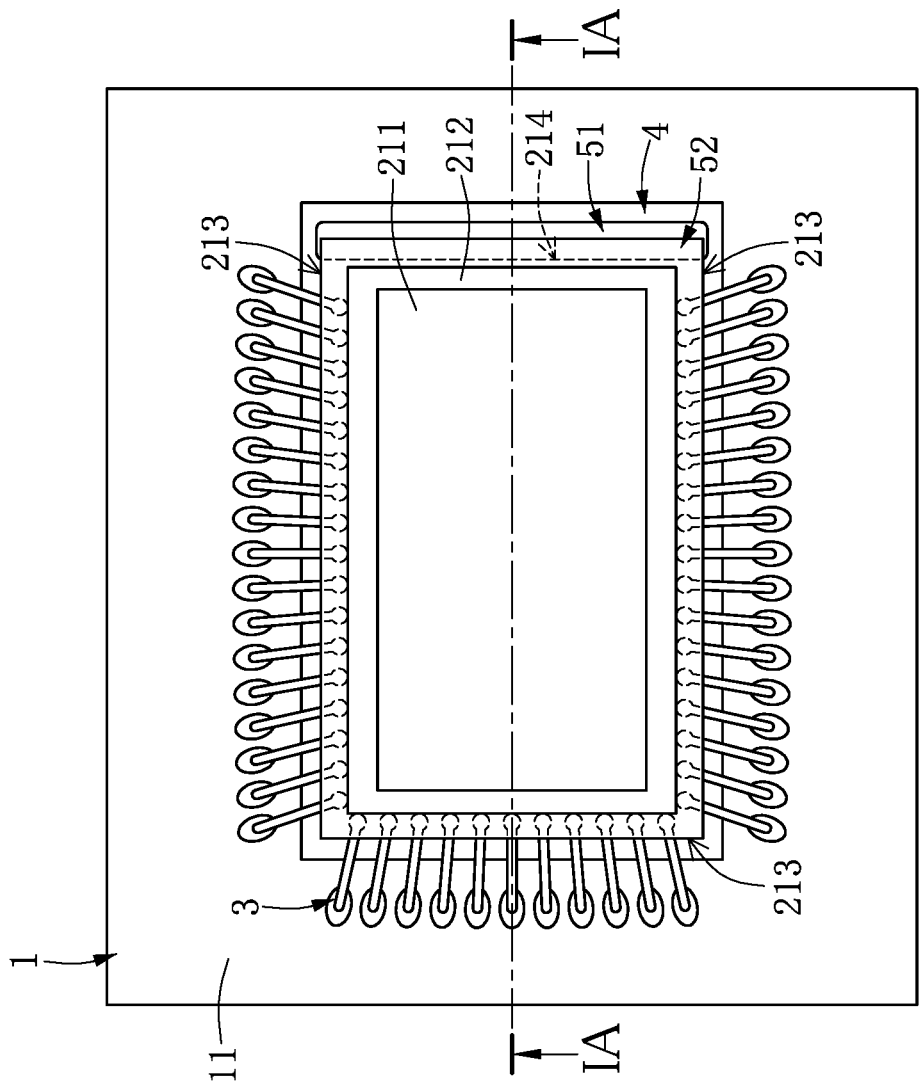
FIG. 3 is a top view of FIG. 1 with the packaging compound omitted.

Reference is made to FIGS. 1 to 9, which illustrate a first embodiment of the present disclosure. As shown in FIGS. 1 to 3, the present embodiment provides, but is not limited to, a sensor package structure 100 (i.e., an image sensor package structure 100). The sensor package structure 100 includes a substrate 1, a sensor chip 2 disposed on the substrate 1, a plurality of metal wires 3 establishing an electrical connection between the substrate 1 and the sensor chip 2, a translucent layer 4 corresponding in position to the sensor chip 2, and an adhesive 5 firmly adhering the translucent layer 4 to the sensor chip 2 and the substrate 1. The following description discloses the structure and connection relationships of each component of the sensor package structure 100.

As shown in FIGS. 1 and 2, the substrate 1 can be a plastic substrate, a ceramic substrate, a lead frame, or a substrate made of other materials, but the present embodiment is not limited thereto. The substrate 1 has an upper surface 11 and a lower surface 12 opposite to the upper surface 11. The substrate 1 includes a plurality of welding pads 111 formed on the upper surface 11. Moreover, the substrate 1 also includes a plurality of welding pads (not labeled) formed on the lower surface 12 for respectively soldering a plurality of soldering balls (not labeled). In other words, the substrate 1 of the present embodiment exemplarily has a ball grid array (BGA) arrangement, but the present disclosure is not limited thereto.

Figure 4:
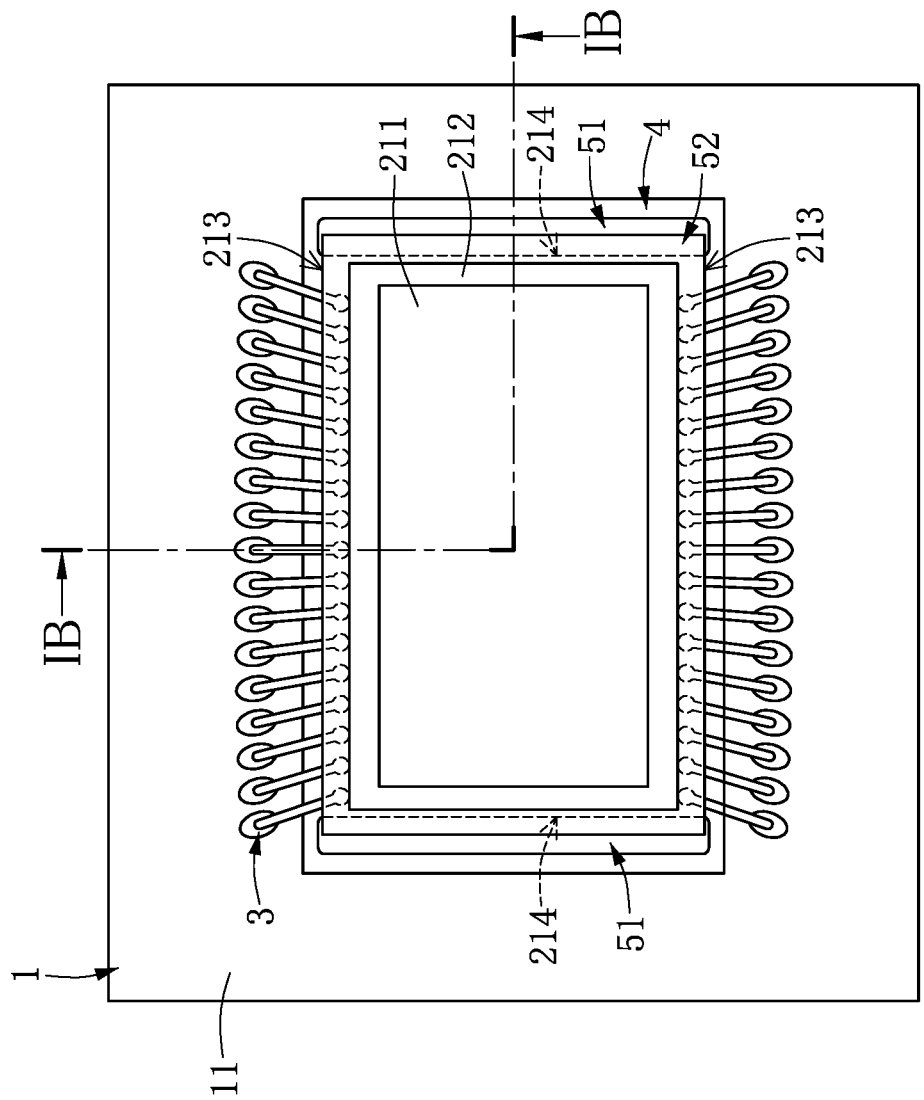
FIG. 4 is a top view of FIG. 1 in another configuration according to the first embodiment with the packaging compound omitted.

As shown in FIGS. 1 and 2, the sensor chip 2 in the present embodiment is exemplarily an image sensor chip, but the present disclosure is not limited thereto. The sensor chip 2 has a top surface 21, a bottom surface 22 opposite to the top surface 21, and a surrounding side 23 perpendicularly connected to the top surface 21 and the bottom surface 22. In the present disclosure, the surrounding side means the side(s) other than the top side and the bottom side. The top surface 21 has a sensing region 211 and a spacing region 212 arranged around the sensing region 211. The sensing region 211 in the present embodiment is in a square shape or a rectangular shape. The center of the sensing region 211 can be the center of the top surface 21 (as shown in FIG. 4), or the center of the sensing region 211 can be arranged apart from the center of the top surface 21 at a distance (as shown in FIGS. 2 and 3). The spacing region 212 in the present embodiment is in a square-ring shape, and each portion of the spacing region 212 has the same width. The specific shape of the spacing region 212 can be adjusted according to practical needs.

Figure 5A:
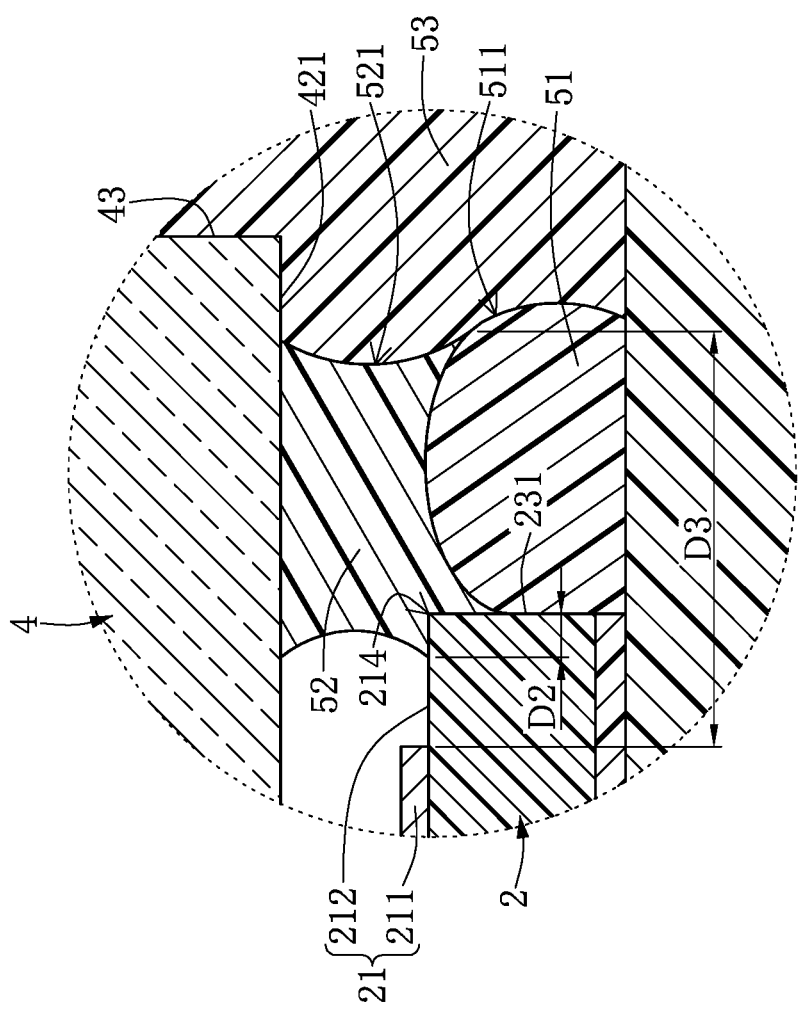
FIG. 5A is an enlarged view of the VA portion of FIG. 1.
Figure 6:
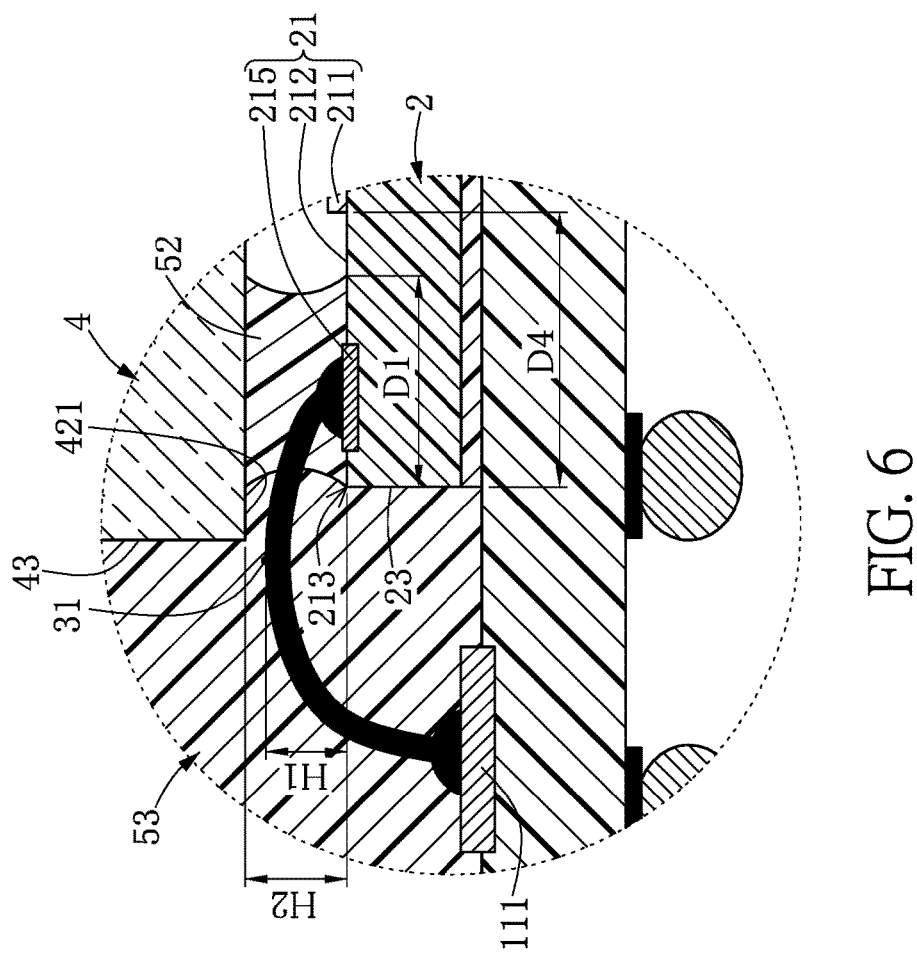
FIG. 6 is an enlarged view of the VI portion of FIG. 1.

Specifically, the top surface 21 has at least one first edge 213 and at least one second edge 214, and the first edge 213 and the second edge 214 are arranged outside the spacing region 212. The surrounding side 23 has at least one side surface 231 connected to the at least one second edge 214. A distance D1 between the first edge 213 and the spacing region 212 (as shown in FIG. 6) is greater than a distance D2 between the second edge 214 and the spacing region 212 (as shown in FIG. 5A). In the present embodiment, the distance D2 is smaller than $1/3$~$1/4$ of the distance D1 (D2<$1/3$~$1/4$D1), but the ratio between the distance D1 and the distance D2 can be adjusted according to practical needs. The sensor chip 2 includes a plurality of connecting pads 215 formed on a first portion of the top surface 21 between the first edge 213 and the spacing region 212, and a second portion of the top surface 21 between the second edge 214 and the spacing region 212 is provided without any connecting pad 215.

The top surface 21 can be formed with a plurality of first edges 213 and a single second edge 214 (as shown in FIG. 3), or the top surface 21 can also be formed with a plurality of first edges 213 and a plurality of second edges 214 (as shown in FIG. 4). In other words, FIG. 1 can be a cross-sectional view taken along a cross-sectional line IA-IA of FIG. 3 or taken along a cross-sectional line IB-IB of FIG. 4. In other embodiments of the present disclosure, the top surface 21 can be formed with a single first edge 213 and a plurality of second edges 214.

Moreover, the bottom surface 22 of the sensor chip 2 is disposed on the upper surface 11 of the substrate 1, and a portion of the upper surface 11 for mounting the sensor chip 2 is substantially arranged in a region, which is surroundingly defined by the welding pads 111. In the present embodiment, the bottom surface 22 of the sensor chip 2 is fixed on the upper surface 11 of the substrate 1 by using a die attach epoxy (not labeled), but the present disclosure is not limited thereto.

As shown in FIGS. 1 to 3, one ends of the metal wires 3 are respectively connected to the welding pads 111 of the substrate 1, and the other ends of the metal wires 3 are respectively connected to the connecting pads 215 of the sensor chip 2. In the present embodiment, each metal wire 3 is in a reverse bond mode, and the top surface 21 of the sensor chip 2 and an adjacent portion of each metal wire 3 (i.e., a portion of each metal wire 3 arranged above the top surface 21 as shown in FIG. 1) have an angle (not labeled) smaller than or equal to 45 degrees. Thus, an apex 31 of each metal wire 3 can be located at a lower height for avoiding contact with the translucent layer 4, but the present disclosure is not limited thereto. For example, the angle can be smaller than or equal to 30 degrees.

As shown in FIGS. 1 to 3, the translucent layer 4 in the present embodiment is exemplarily a glass plate, but is not limited thereto. For example, the translucent layer 4 can be a transparent plate or a semi-transparent plate. The translucent layer 4 has a first surface 41, a second surface 42 opposite to the first surface 41, and a surrounding side 43 perpendicularly connected to the first surface 41 and the second surface 42. In the present embodiment, the first surface 41 and the second surface 42 have the same square shape or the same rectangular shape, and an area of the second surface 42 is greater than that of the top surface 21 of the sensor chip 2, but the present disclosure is not limited thereto.

Moreover, the translucent layer 4 is fixed on the substrate 1 and the sensor chip 2 by using the adhesive 5, and the second surface 42 of the translucent layer 4 is substantially parallel to and faces toward the top surface 21 of the sensor chip 2. Specifically, a projecting area (not labeled) defined by orthogonally projecting the sensor chip 2 onto the second surface 42 is entirely located in the second surface 42. In addition, the second surface 42 of the translucent layer 4 is arranged adjacent to, but does not contact with, each metal wire 3. The apex 31 of each metal wire 3 is arranged outside a space defined by orthogonally projecting the translucent layer 4 to the substrate 1. As shown in FIGS. 1 and 6, a height H1 of the apex 31 of each metal wire 3 with respect to the top surface 21 of the sensor chip 2 is preferably smaller than a height H2 of the second surface 42 of the translucent layer 4 with respect to the top surface 21 of the sensor chip 2, but the present disclosure is not limited thereto.

As shown in FIGS. 1, 5A, and 6, the adhesive 5 can be a single piece made of the same material or a composite piece made of different materials, but the present embodiment is not limited thereto. The adhesive 5 is disposed on the upper surface 11 of the substrate 1 and covers the surrounding side 23 of the sensor chip 2, the first portion of the top surface 21 between the first edge 213 and the spacing region 212, and the surrounding side 43 and a portion of the second surface 42 of the translucent layer 4. At least part of each of the metal wires 3 and each of the welding pads 111 are embedded in the adhesive 5.

Specifically, the adhesive 5 in the present embodiment includes a supporting layer 51, a combining layer 52, and a packaging compound 53, the three of which are connected with each other. The material of the supporting layer 51 (i.e., a glass mount epoxy) is preferably to the same as that of the combining layer 52, but the material of the packaging compound 53 (i.e., a liquid compound) is preferably different from that of the supporting layer 51. The following description discloses the connection relationships of each part of the adhesive 5 with respect to the other components.

As shown in FIGS. 1, 2 and 5A, the supporting layer 51 in the present embodiment corresponds in shape and position to the second edge 214 of the top surface 21 of the sensor chip 2. For example, the supporting layer 51 as shown in FIG. 3 is an elongated structure substantially parallel to the second edge 214, or the supporting layer 51 as shown in FIG. 4 includes two elongated structures respectively parallel to the two second edges 214. The supporting layer 51 is arranged adjacent to the second edge 214 of the sensor chip 2 (i.e., the supporting layer 51 contacts the side surface 231 of the sensor chip 2 connected to the second edge 214). An edge of the supporting layer 51 (i.e., the top edge of the supporting layer 51 as shown in FIG. 5A) arranged distant from the substrate 1 has a height substantially equal to a height of the top surface 21 (or the second edge 214) of the sensor chip 2.

Figure 5B:
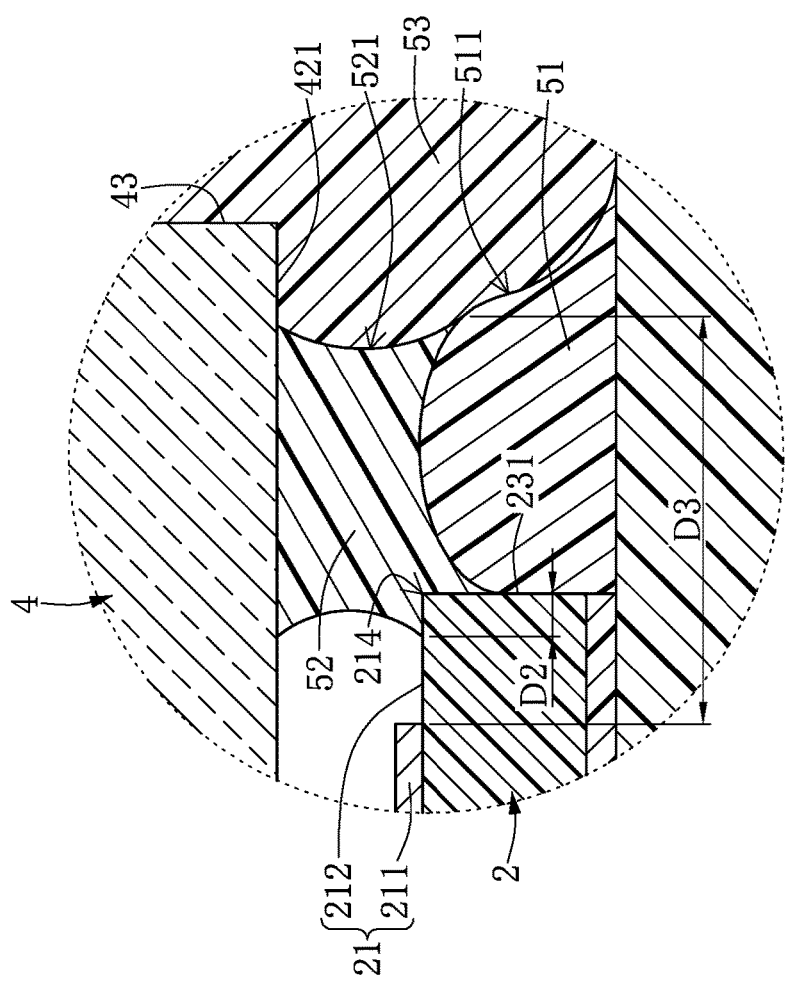
FIG. 5B is an enlarged view showing another configuration of FIG. 5A according to the first embodiment.

Specifically, an outer side 511 of the supporting layer 51 arranged distant from the sensor chip 2 includes an arc surface 511 having a center of circle (not labeled) located at an interior side of the packaging compound 53 (i.e., the center of circle is located in the supporting layer 51), but the present disclosure in not limited thereto. For example, as shown in FIG. 5B, the center of circle (not labeled) of the arc surface 511 can be located in the packaging compound 53.

As shown in FIGS. 2, 5A, and 6, the combining layer 52 is substantially in a square ring shape or a rectangular ring shape, and an inner edge of the combining layer 52 is preferably connected to the an outer edge of the spacing region 212 of the sensor chip 2. That is to say, the spacing region 212 is provided for separating the combining layer 52 from the sensing region 211. The combining layer 52 is disposed on the supporting layer 51 and the first portion of the top surface 21, the latter of which is disposed between the first edge 213 and the spacing region 212, and a portion of the combining layer 52 disposed on the supporting layer 51 (as shown in FIG. 5A) is further disposed on the second portion of the top surface 21 between the second edge 214 and the spacing region 212. An area of the second portion of the top surface 21 is preferably smaller than that of a portion of the spacing region 212 connected to the second portion of the top surface 21. In other words, in other embodiments of the present disclosure, when the portion of the combining layer 52 disposed on the supporting layer 51 is not disposed on the top surface 21, the second edge 214 of the top surface 21 is an outer edge of the spacing region 212.

Specifically, a width and a height of the portion of the combining layer 52 disposed on the supporting layer 51 (as shown in FIG. 5A) are substantially equal to that of a portion of the combining layer 52 disposed on first portion of the top surface 21 (as shown in FIG. 6). A surrounding side 521 of the combining layer 52 arranged distant from the sensing region 211 includes an arc surface 521 having a center of circle located in the packaging compound 53. A largest distance D3 (as shown in FIG. 5A) between the arc surface 521 of the combining layer 52 and the sensing region 211 is preferably and substantially equal to a distance D4 (as shown in FIG. 6) between the first edge 213 and the sensing region 211. In a cross-section of the sensor package structure 100 perpendicular to the upper surface 11 (as shown in FIG. 5A), the arc surface 521 of the combining layer 52 and the arc surface 511 of the supporting layer 51 are in an S-shape, but the present disclosure is not limited thereto (i.e., FIG. 5B).

Moreover, a part of each metal wire 3 is embedded in the combining layer 52. In other words, each connecting pad 215 and a part of the corresponding metal wire 3 connected thereto in the present embodiment are embedded in the combining layer 52. However, in other embodiments of the present disclosure, each connecting pad 215 and a part of the corresponding metal wire 3 connected thereto can be not embedded in the combining layer 52.

In addition, as shown in FIG. 1, a portion the second surface 42 of the translucent layer 4 is adhered to the combining layer 52, so that the second surface 42 of the translucent layer 4, the combining layer 52, and the top surface 21 of the sensor chip 2 surroundingly co-define an enclosed space 6, and the sensing region 211 of the sensor chip 2 is arranged in the enclosed space 6. The second surface 42 has a fixing region 421 arranged outside the portion of the second surface 42 adhered to the combining layer 52, and the fixing region 421 is in a square ring shape or a rectangular ring shape.

As shown in FIGS. 1, 5A, and 6, the packaging compound 53 is disposed on the upper surface 11 of the substrate 1 and covers the surrounding side 23 of the sensor chip 2, the outer side 511 of the supporting layer 51, the surrounding side 521 of the combining layer 52, and the surrounding side 43 and the fixing region 421 of the translucent layer 4. Each of the metal wires 3 in the present embodiment is embedded in the packaging compound 53 and the combining layer 52, and the apex 31 of each of the metal wires 3 is embedded in the packaging compound 53. However, in other embodiments of the present disclosure, each of the metal wires 3 can be embedded entirely in the packaging compound 53.

Specifically, the first surface 41 of the translucent layer 4 and an adjacent surface of the packaging compound 53 (i.e., the top surface of the packaging compound 53 as shown in FIG. 1) have an angle Φ within a range of 90~180 degrees, and the angle Φ is preferably within a range of 115~150 degrees. A surrounding side surface of the packaging compound 53 other than the top surface and the bottom surface is substantially flush with a surrounding side surface of the substrate 1. Moreover, the packaging compound 53 in the present embodiment is not disposed on the first surface 41 of the translucent layer 4, but the packaging compound 53 in other embodiments of the present disclosure can be disposed on a part of the first surface 41 (i.e., a periphery part of the first surface 41) of the translucent layer 4.

In summary, the sensor chip 2 in the present embodiment, which has the second portion provided without any connecting pad 215, can be adapted in the sensor package structure 100. That is to say, the sensor package structure 100 of the present embodiment can be suitable to package the sensor chip 2 which has a smaller size. Furthermore, the sensor package structure 100 can also package the smaller sensor chip 2 by embedding part of each metal wire 3 in the combining layer 52.

The translucent layer 4 can be firmly fixed at a predetermined position by adhering the packaging compound 53 to the arc surface 511 of the supporting layer 51, the arc surface 521 of the combining layer 52, and the surrounding side 43 and the fixing region 421 of the translucent layer 4. Moreover, the translucent layer 4 can be maintained to not contact each metal wire 3, so that the translucent layer 4 is substantially parallel to the top surface 21 of the sensor chip 2, thereby providing a better reliability of the sensor package structure 100.

The supporting layer 51 is formed in one process, and the combining layer 52 is later formed in another process, so that the supporting layer 51 is formed to be an extension for a shorter portion of the sensor chip 2 (i.e., the second portion of the top surface 21 between the sensing region 211 and the second edge 214). Thus, the supporting layer 51 can provide a space sufficient to receive the combining layer 52, preventing the combining layer 52 from contacting the sensing region 211.

In addition, the sensor package structure 100 as shown in FIGS. 1 to 6 can be adjusted according to practical needs, but as the present disclosure cannot disclose all varieties of configurations, the following description will only disclose some exemplary configurations of the sensor package structure 100.

Figure 7:
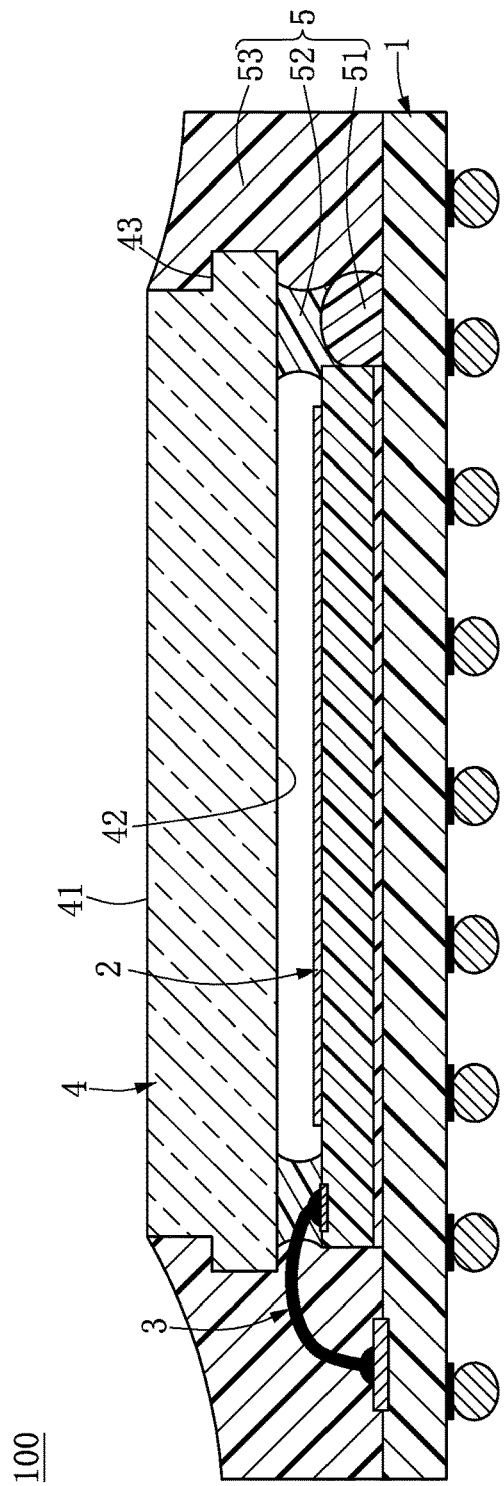
FIG. 7 is a cross-sectional view showing the sensor package structure in yet another configuration according to the first embodiment.

As shown in FIG. 7, the surrounding side 43 of the translucent layer 4 is in a step shape and is embedded in the packaging compound 53. An area of the first surface 41 is smaller than that of the second surface 42. However, in other embodiments of the present disclosure, the area of the first surface 41 can be greater than that of the second surface 42.

Figure 8:
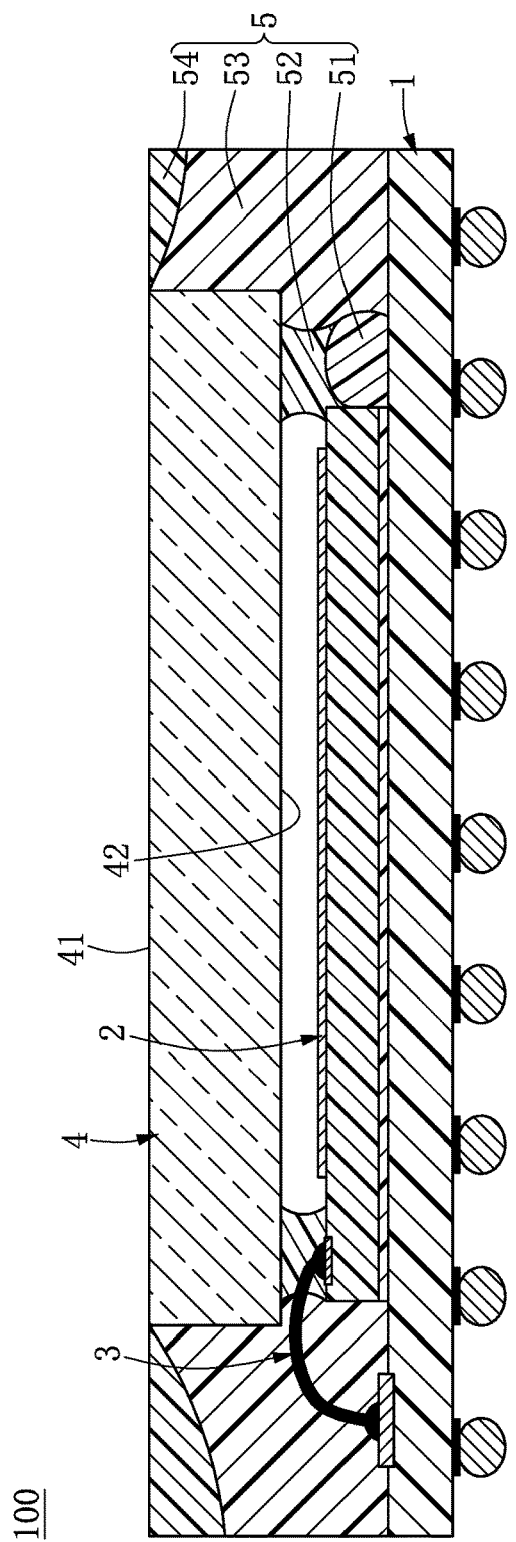
FIG. 8 is a cross-sectional view showing the sensor package structure in yet another configuration according to the first embodiment.

As shown in FIG. 8, the sensor package structure 100 can further include a molding compound 54 disposed on a top surface of the packaging compound 53. A top surface of the molding compound 54 is substantially parallel to the first surface 41 of the translucent layer 41, and a surrounding side surface of the molding compound 54 other than the top surface and the bottom surface is coplanar with a surrounding side surface of the packaging compound 53, but the present disclosure is not limited thereto. Moreover, the top surface of the molding compound 54 can be substantially coplanar with the first surface 41 of the translucent layer 41.

Figure 9:
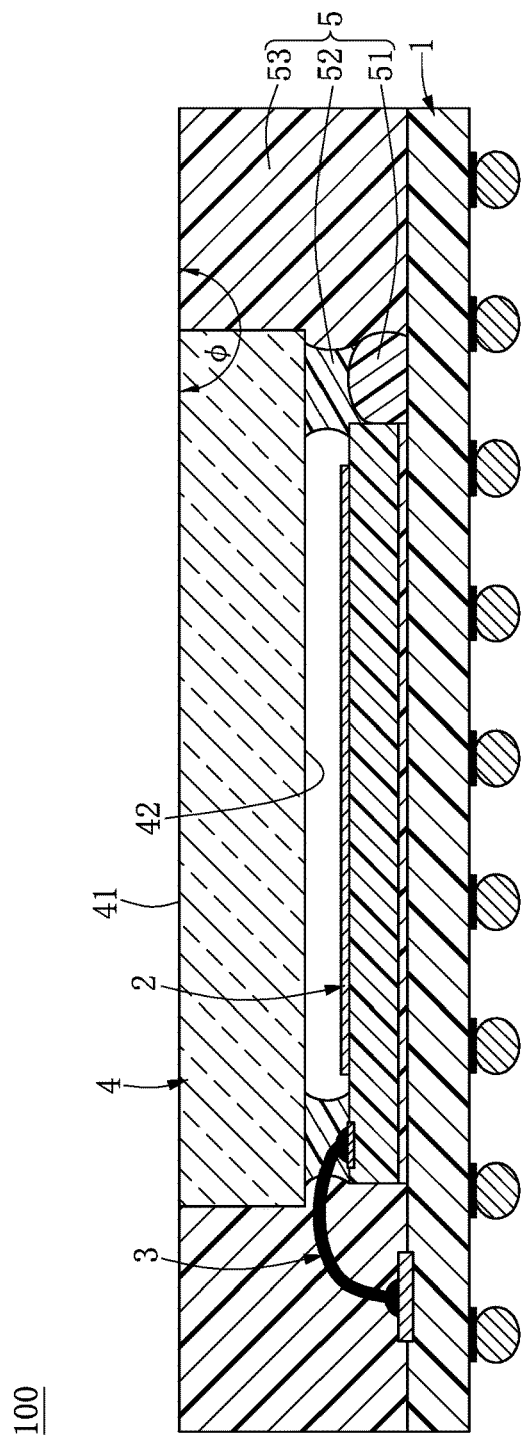
FIG. 9 is a cross-sectional view showing the sensor package structure in yet another configuration according to the first embodiment.

As shown in FIG. 9, the packaging compound 53 can be a molding compound, and the first surface 41 of the translucent layer 4 is substantially parallel to an adjacent surface of the packaging compound 53. Moreover, the first surface 41 of the translucent layer 4 and the adjacent surface of the packaging compound 53 preferably have an angle Φ of 180 degrees.

Second Embodiment

Figure 10:
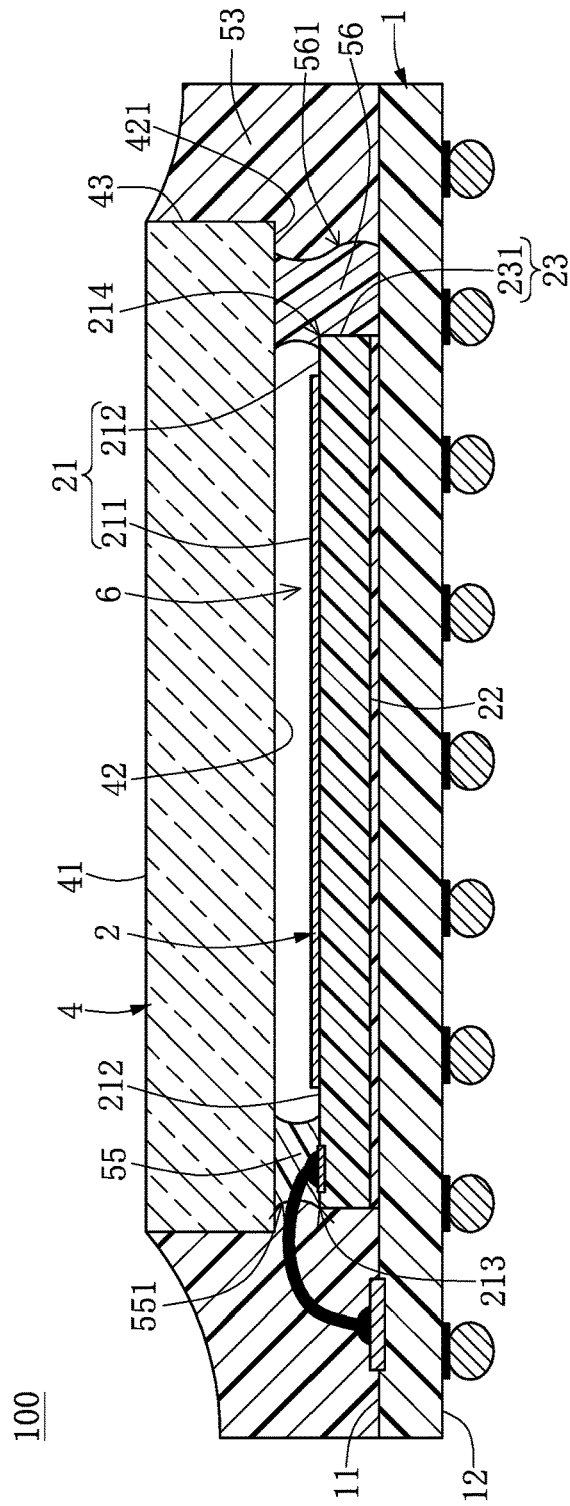
FIG. 10 is a cross-sectional view showing a sensor package structure according to a second embodiment of the present disclosure.

Reference is made to FIG. 10, which illustrates a second embodiment of the present disclosure. The present embodiment is similar to the first embodiment, except that in the second embodiment, the combining layer 52 and the supporting layer 51 are replaced by a first combining layer 55 and a second combining layer 56. Specifically, in the present embodiment, the supporting layer 51 and a portion of the combining layer 52 disposed on the supporting layer 51 (as shown in FIG. 5) as disclosed in the first embodiment are adjusted to be formed in one process and are co-defined as the second combining layer 56, and the other portion of the combining layer 52 (as shown in FIG. 6) is adjusted to be formed in another process and is defined as the first combining layer 55, but the present disclosure is not limited thereto. The structural features of the present embodiment different from the first embodiment are disclosed as follows.

The first combining layer 55 is disposed on the first portion of the top surface 21 between the first edge 213 and the spacing region 212. The second combining layer 56 is disposed on the upper surface 11 of the substrate 1 and is arranged adjacent to the second edge 214 of the sensor chip 2 (i.e., the second combining layer 56 contacts the side surface 231 of the sensor chip 2). The second combining layer 56 can be further disposed on the second portion of the top surface 21 between the second edge 214 and the spacing region 212, and an area of the second portion of the top surface 21 is smaller than that of a portion of the spacing region 212 connected to the second portion of the top surface 21. A height of the second combining layer 56 with respect to the upper surface 11 of the substrate 1 is substantially equal to that of the first combining layer 55 with respect to the upper surface 11 of the substrate 1.

Moreover, a largest distance between an upper half of an outer side 561 of the second combining layer 56 and the sensing region 211 is substantially equal to a distance between the first edge 213 and the sensing region 211. An outer side 551 of the first combining layer 55 arranged distant from the sensing region 211 includes an arc surface 551 having a center of circle located in the packaging compound 53. In a cross-section of the sensor package structure 100 perpendicular to the upper surface 11 of the substrate 1, the outer side 561 of the second combining layer 56 arranged distant from the sensor chip 2 is in an S-shape, but the present disclosure is not limited thereto (e.g., FIG. 5B).

A portion of the second surface 42 of the translucent layer 4 is adhered to the first combining layer 55 and the second combining layer 56. The second surface 42 has a fixing region 421 arranged outside the portion of the second surface 42 adhered to the first combining layer 55 and the second combining layer 56.

The packaging compound 53 is disposed on the upper surface 11 of the substrate 1 and covers the surrounding side 23 of the sensor chip 2, the outer side 551 of the first combining layer 55, the outer side 561 of the second combining layer 56, and the surrounding side 43 and the fixing region 421 of the translucent layer 4. A part of each metal wire 3 and each welding pad 111 are embedded in the packaging compound 53.

Third Embodiment

Figure 11:
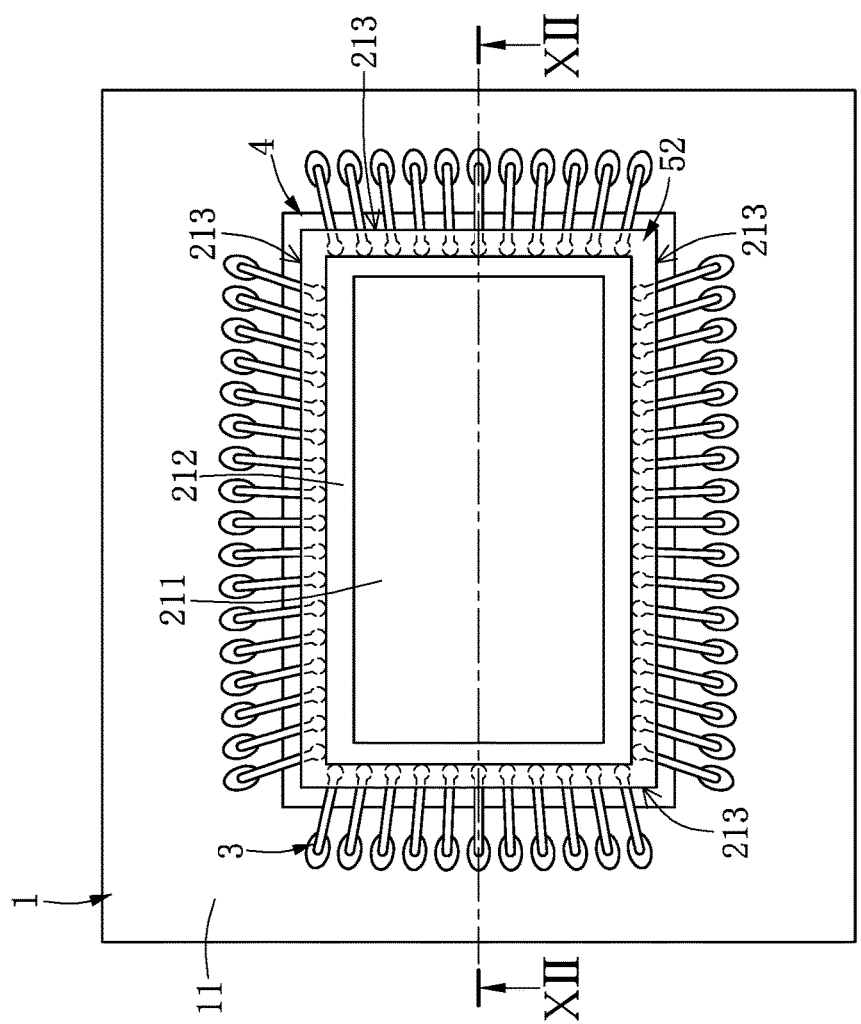
FIG. 11 is a top view showing a sensor package structure according to a third embodiment of the present disclosure.
Figure 12:
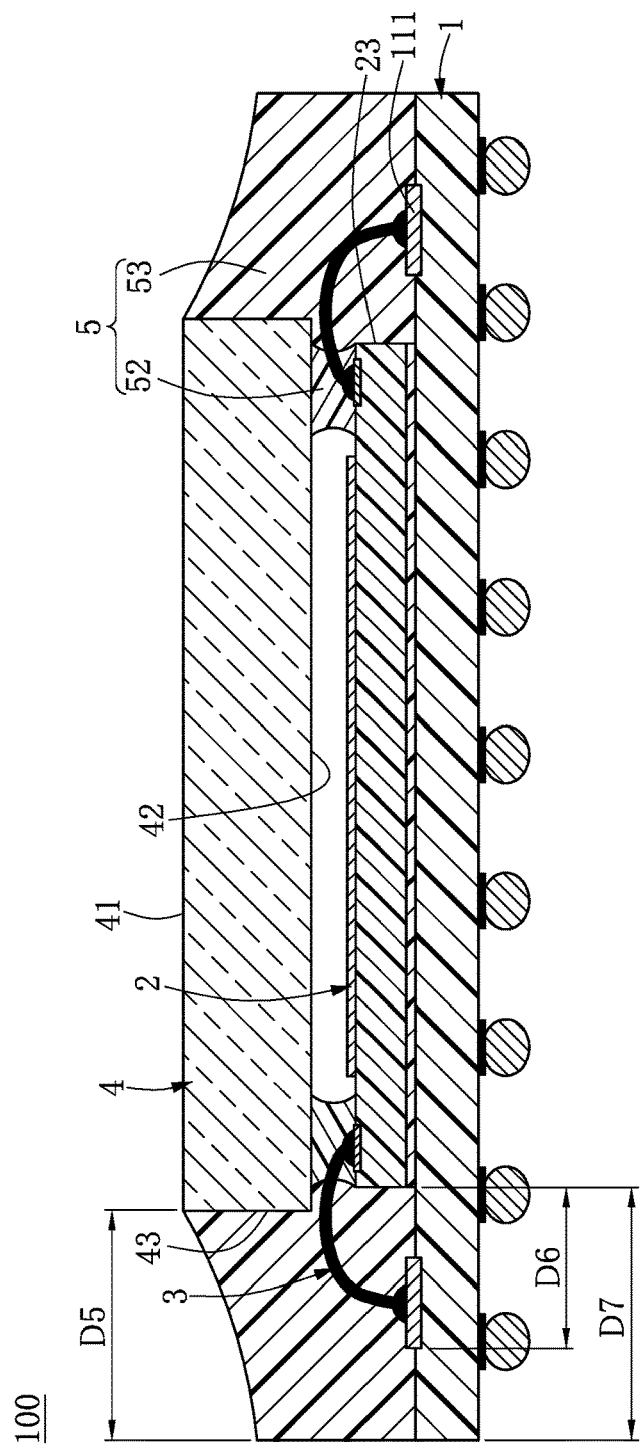
FIG. 12 is a cross-sectional view taken along a cross-sectional line XII-XII of FIG. 11.

Reference is made to FIGS. 11 and 12, which illustrate a third embodiment of the present disclosure. The present embodiment is similar to the first embodiment, except that the sensor package structure 100 of the third embodiment is provided without any supporting layer 51; that is to say, the edges of the top surface 21 of the sensor chip 2 in the present embodiment are first edges 213.

It should be noted that the size of the sensor package structure 100 as disclosed in the above three embodiments can be reduced. Specifically, as shown in FIG. 12, a distance D5 between the surrounding side 43 of the translucent layer 4 and an adjacent side of the packaging compound 53 is substantially 300~500 µm, a largest distance D6 between a surrounding side of each of the welding pads 111 and an adjacent portion of the surrounding side 23 of the sensor chip 2 is substantially 200~350 µm, and a distance D7 between the portion of the surrounding side 23 of the sensor chip 2 adjacent to at least one of the welding pads 111 and an adjacent side surface of the packaging compound 53 is substantially 375~575 µm. Thus, the size of the sensor package structure 100 is smaller than that of the conventional sensor package structure, and the amount of the packing compound 53 of the sensor package structure 100 is less than that of the conventional sensor package structure, so that the thermal expansion and contraction of the packaging compound 53 generates less stress to the sensor package structure 100, thereby increasing the reliability of the sensor package structure 100.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A sensor package structure, comprising:
a substrate having an upper surface and a lower surface opposite to the upper surface, wherein the substrate includes a plurality of welding pads formed on the upper surface;
a sensor chip having a top surface and a bottom surface opposite to the top surface, the bottom surface of the sensor chip being disposed on the upper surface of the substrate, the top surface having a sensing region and a spacing region arranged around the sensing region, wherein the top surface has at least one first edge and at least one second edge, a distance between the at least one first edge and the spacing region is greater than a distance between the at least one second edge and the spacing region, the sensor chip includes a plurality of connecting pads formed on a first portion of the top surface between the at least one first edge and the spacing region, and a second portion of the top surface between the at least one second edge and the spacing region is provided without any connecting pad;
a plurality of metal wires, wherein one ends of the metal wires are respectively connected to the welding pads, and the other ends of the metal wires are respectively connected to the connecting pads;
a translucent layer having a first surface and a second surface opposite to the first surface, wherein the second surface of the translucent layer faces toward the top surface of the sensor chip; and
an adhesive disposed on the upper surface of the substrate and covering a surrounding side of the sensor chip, the first portion of the top surface, and a surrounding side and a portion of the second surface of the translucent layer, wherein at least part of each of the metal wires and each of the connecting pads are embedded in the adhesive,
wherein the first surface of the translucent layer is at least partially exposed from the adhesive, and the adhesive includes:
  a supporting layer arranged adjacent to the at least one second edge, wherein an edge of the supporting layer arranged distant from the substrate has a height substantially equal to a height of the upper surface of the sensor chip;
  a combing layer disposed on the supporting layer and the first portion of the top surface of the sensor chip, wherein the portion of the second surface of the translucent layer is adhered to the combing layer; and
  a packaging compound disposed on the upper surface of the substrate and covering the surrounding side of the sensor chip, an outer side of the supporting layer arranged distant from the sensor chip, a surrounding side of the combining layer arranged distant from the sensing region, and the surrounding side of the translucent layer, wherein at least part of each of the metal wires and each of the welding pads are embedded in the packaging compound.

2. The sensor package structure as claimed in claim 1, wherein the outer side of the supporting layer includes an arc surface having a center of circle located at an interior side of the packaging compound.

3. The sensor package structure as claimed in claim 1, wherein the surrounding side of the combining layer includes an arc surface having a center of circle located in the packaging compound.

4. The sensor package structure as claimed in claim 1, wherein a distance between the surrounding side of the combining layer and the sensing region is substantially equal to a distance between the at least one first edge and the sensing region.

5. The sensor package structure as claimed in claim 1, wherein the combining layer is further disposed on the second portion of the top surface between the at least one second edge and the spacing region.

6. The sensor package structure as claimed in claim 5, wherein an area of the second portion of the top surface is smaller than that of a portion of the spacing region connected to the second portion of the top surface.

7. The sensor package structure as claimed in claim 1, wherein a projecting area defined by orthogonally projecting the sensor chip onto the second surface is entirely located in the second surface, the second surface has a fixing region arranged outside the portion of the second surface adhered to the combining layer, and the packaging compound covers the fixing region.

8. A sensor package structure, comprising:
a substrate having an upper surface and a lower surface opposite to the upper surface, wherein the substrate includes a plurality of welding pads formed on the upper surface;
a sensor chip having a top surface and a bottom surface opposite to the top surface, the bottom surface of the sensor chip being disposed on the upper surface of the substrate, the top surface having a sensing region and a spacing region arranged around the sensing region, wherein the top surface has at least one first edge and at least one second edge, a distance between the at least one first edge and the spacing region is greater than a distance between the at least one second edge and the spacing region, the sensor chip includes a plurality of connecting pads formed on a first portion of the top surface between the at least one first edge and the spacing region, and a second portion of the top surface between the at least one second edge and the spacing region is provided without any connecting pad;
a plurality of metal wires, wherein one ends of the metal wires are respectively connected to the welding pads, and the other ends of the metal wires are respectively connected to the connecting pads;
a translucent layer having a first surface and a second surface opposite to the first surface, wherein the second surface of the translucent layer faces toward the top surface of the sensor chip; and
an adhesive disposed on the upper surface of the substrate and covering a surrounding side of the sensor chip, the first portion of the top surface, and a surrounding side and a portion of the second surface of the translucent layer, wherein at least part of each of the metal wires and each of the connecting pads are embedded in the adhesive, and wherein the adhesive includes:
  a supporting layer arranged adjacent to the at least one second edge, wherein an edge of the supporting layer arranged distant from the substrate has a height substantially equal to a height of the upper surface of the sensor chip;
  a combing layer disposed on the supporting layer and the first portion of the top surface of the sensor chip, wherein the portion of the second surface of the translucent layer is adhered to the combing layer;
  a packaging compound disposed on the upper surface of the substrate and covering the surrounding side of the sensor chip, an outer side of the supporting layer arranged distant from the sensor chip, a surrounding side of the combining layer arranged distant from the sensing region, and the surrounding side of the translucent layer, wherein at least part of each of the metal wires and each of the welding pads are embedded in the packaging compound.

9. The sensor package structure as claimed in claim 8, wherein the outer side of the supporting layer includes an arc surface having a center of circle located at an interior side of the packaging compound.

10. The sensor package structure as claimed in claim 8, wherein the surrounding side of the combining layer includes an arc surface having a center of circle located in the packaging compound.

11. The sensor package structure as claimed in claim 8, wherein a distance between the surrounding side of the combining layer and the sensing region is substantially equal to a distance between the at least one first edge and the sensing region.

12. The sensor package structure as claimed in claim 8, wherein the combining layer is further disposed on the second portion of the top surface between the at least one second edge and the spacing region.

13. The sensor package structure as claimed in claim 12, wherein an area of the second portion of the top surface is smaller than that of a portion of the spacing region connected to the second portion of the top surface.

14. The sensor package structure as claimed in claim 8, wherein a projecting area defined by orthogonally projecting the sensor chip onto the second surface is entirely located in the second surface, the second surface has a fixing region arranged outside the portion of the second surface adhered to the combining layer, and the packaging compound covers the fixing region.

* * * * *